United States Patent [19]

Temple

[11] 4,242,690
[45] Dec. 30, 1980

[54] HIGH BREAKDOWN VOLTAGE SEMICONDUCTOR DEVICE

[75] Inventor: Victor A. K. Temple, Clifton Park, N.Y.

[73] Assignee: General Electric Company, Schenectady, N.Y.

[21] Appl. No.: 913,026

[22] Filed: Jun. 6, 1978

[51] Int. Cl.³ .................................... H01L 29/90
[52] U.S. Cl. ............................ 357/13; 357/55; 357/88; 357/89
[58] Field of Search ................ 357/55, 13, 88, 89

[56] References Cited

U.S. PATENT DOCUMENTS 3,971,061  7/1976  Matsushita ............................ 357/52
4,153,904  5/1979  Tasch, Jr. ............................. 357/13
4,155,777  5/1979  Dunkley ............................... 148/1.5

Primary Examiner—Martin H. Edlow
Attorney, Agent, or Firm—Marvin Snyder; James C. Davis

[57] ABSTRACT

A precisely formed region of semiconductor material which correspondingly contains a precisely controlled amount of charge when depleted is provided in the proximity of a p-n junction in several kinds of semiconductor devices. This region is located within the selected semiconductor device in such a manner as to increase avalanche breakdown voltage of a p-n junction to near its ideal value and to reduce both peak bulk and peak surface electric fields.

17 Claims, 33 Drawing Figures

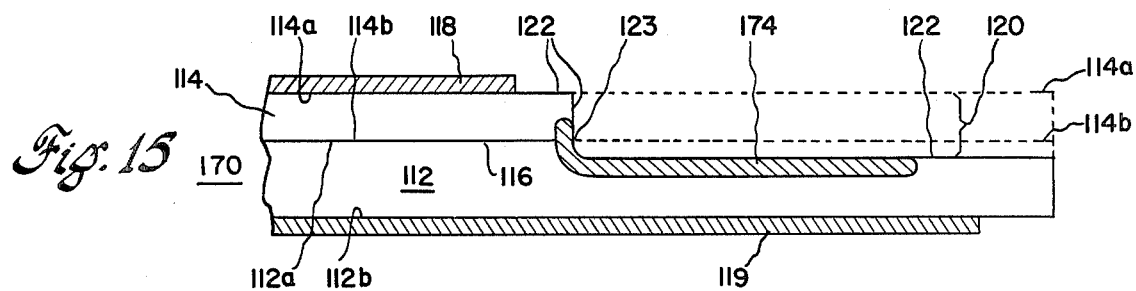
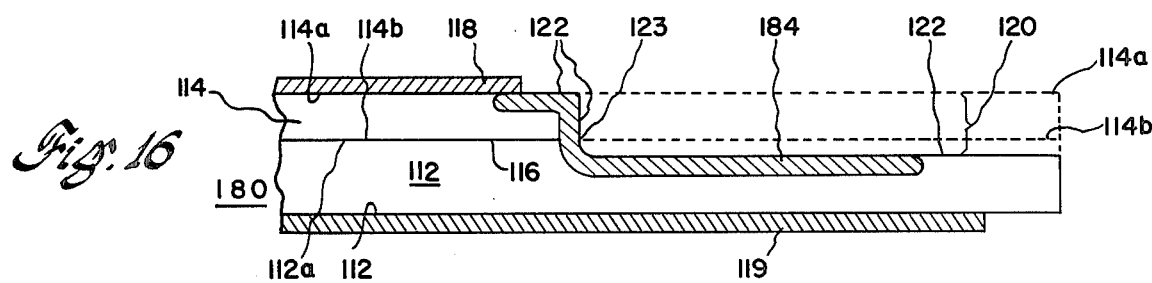
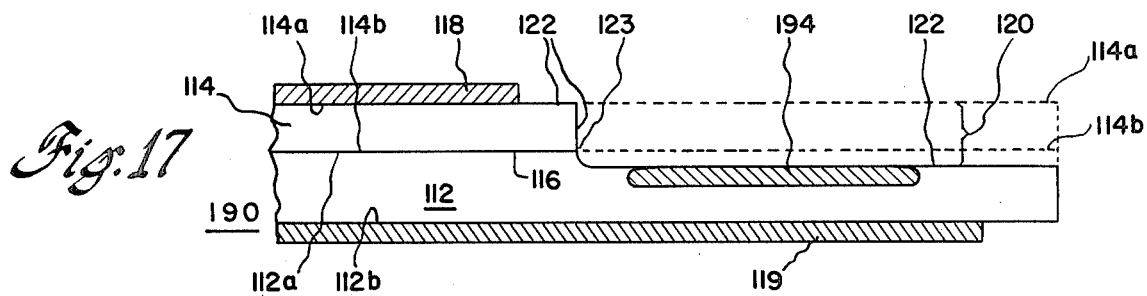
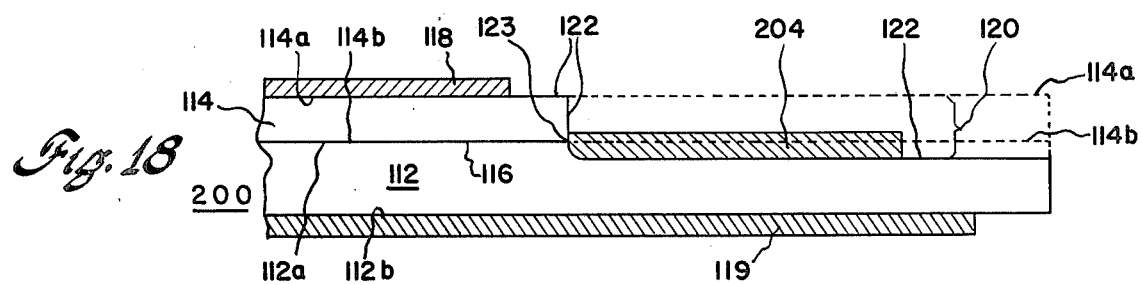
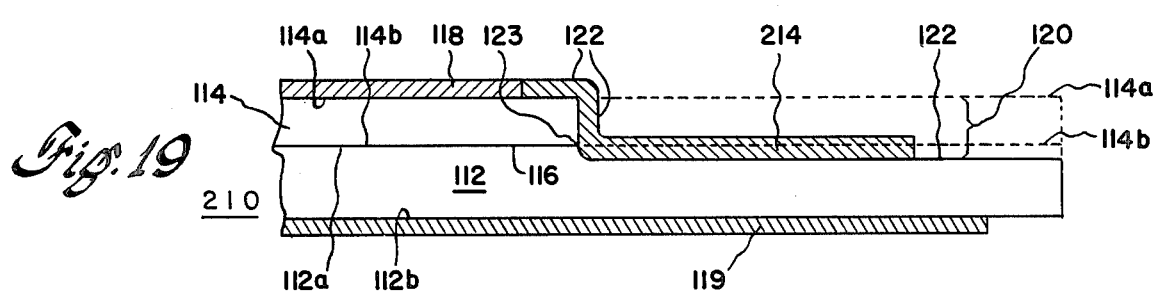

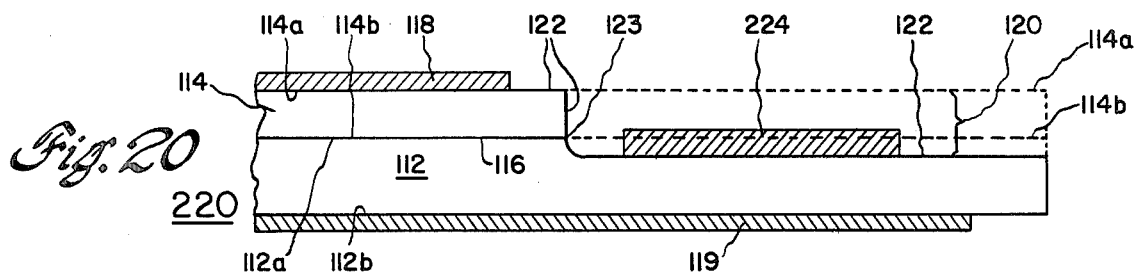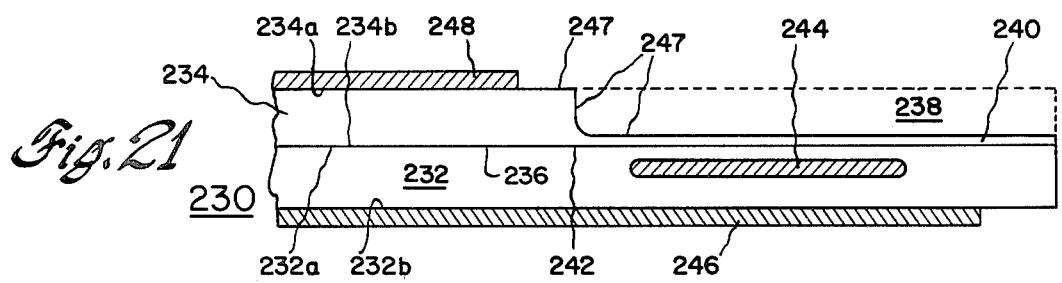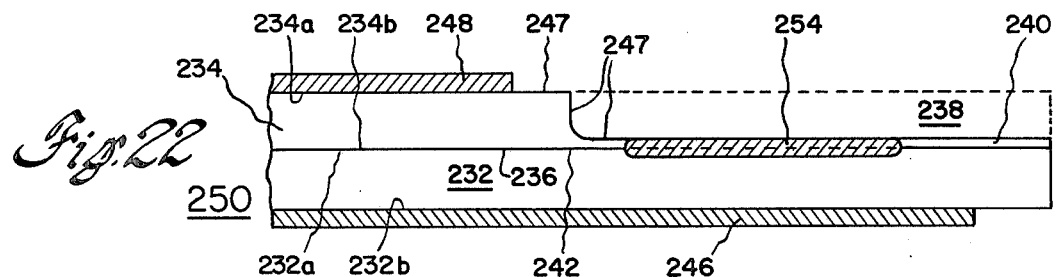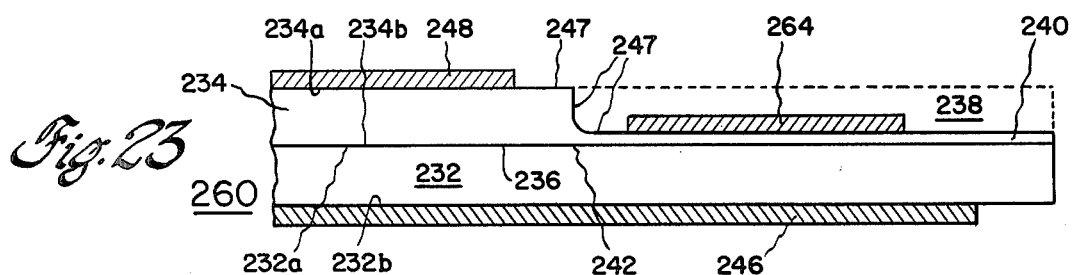

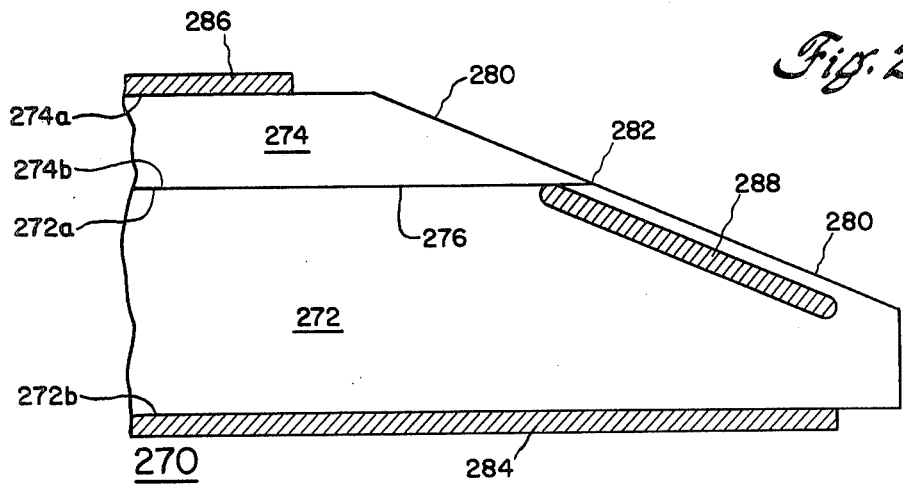
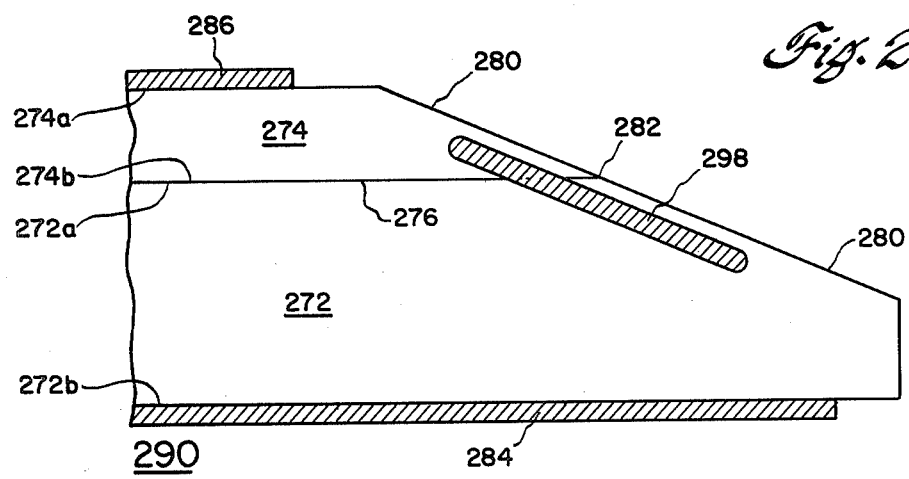
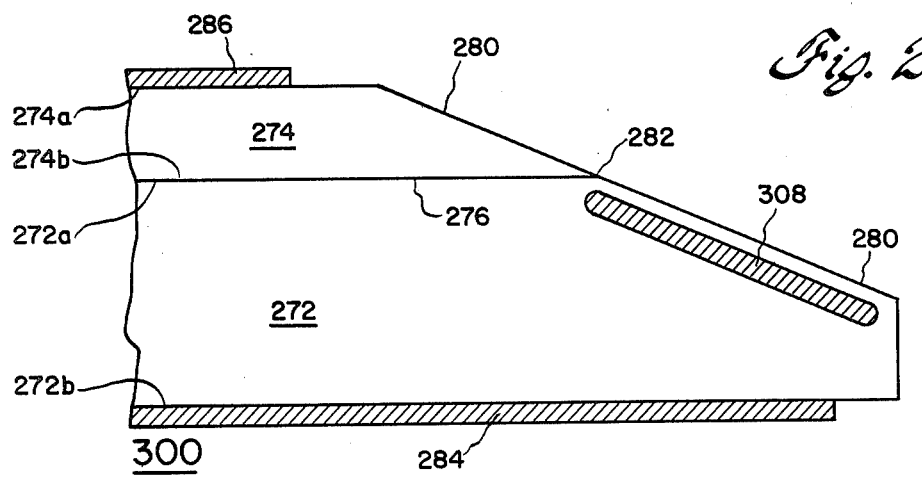

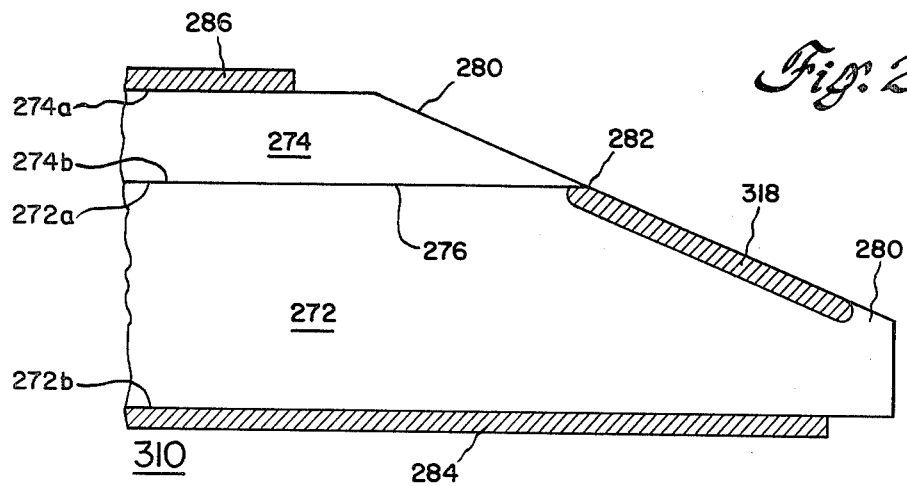
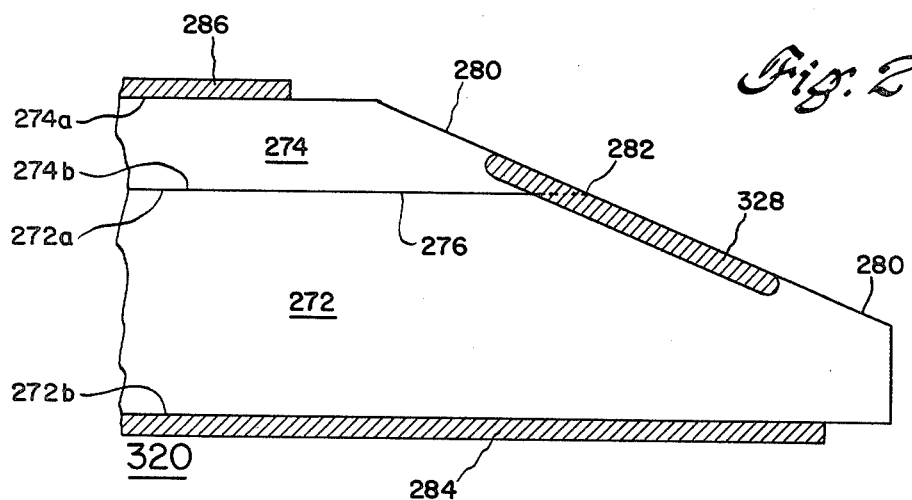
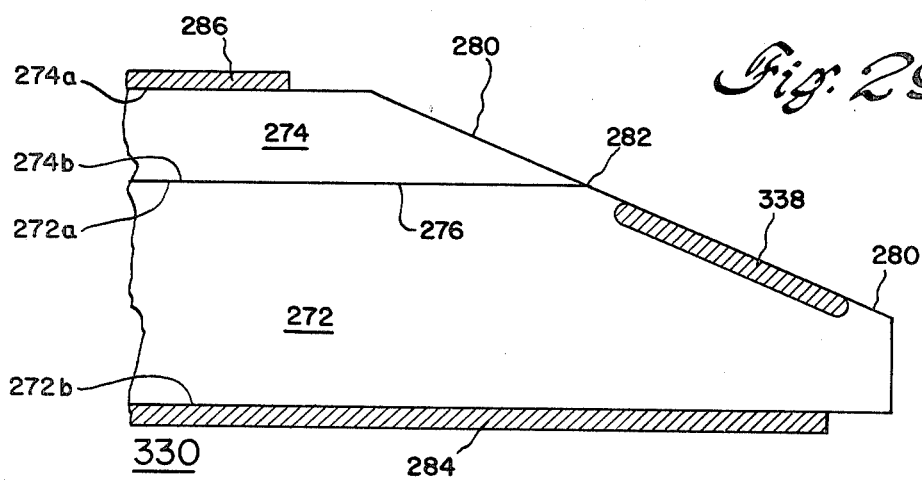

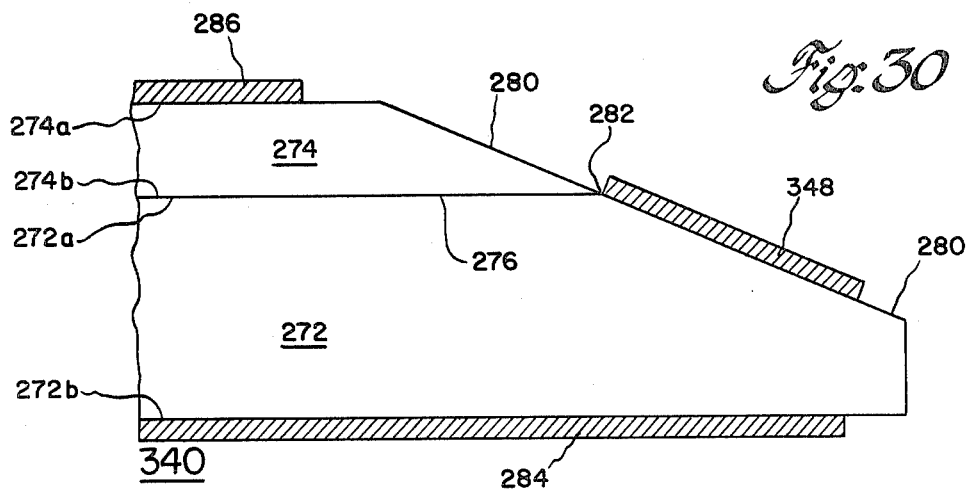
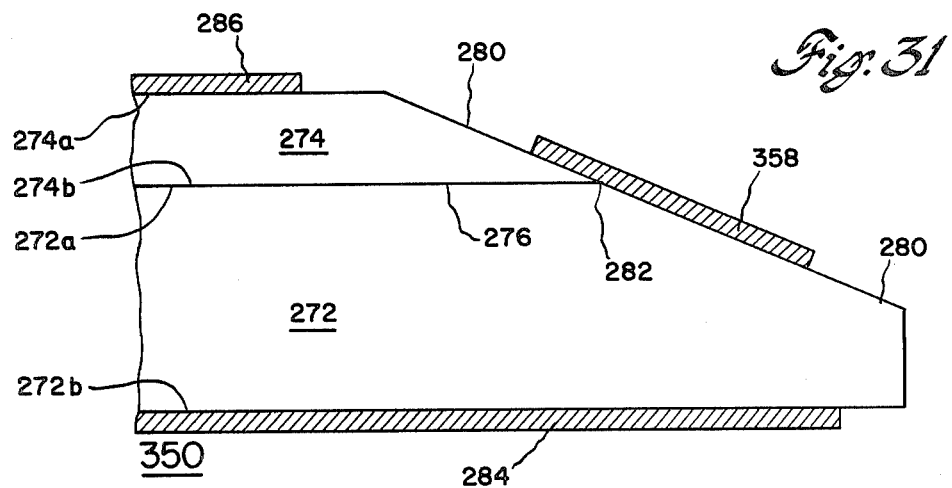
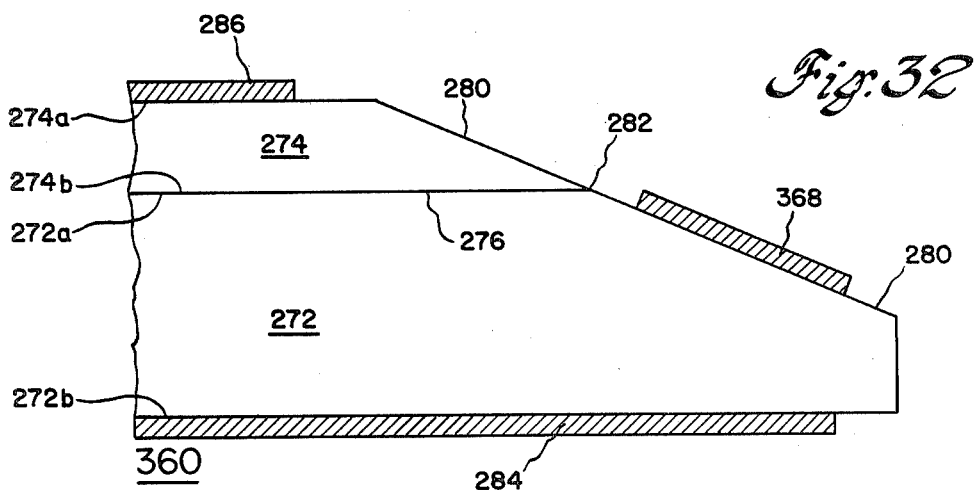

HIGH BREAKDOWN VOLTAGE SEMICONDUCTOR DEVICE

BACKGROUND OF THE INVENTION

This invention relates to semiconductor devices, and more particularly to semiconductor devices including at least one p-n junction with high avalanche breakdown voltage and having low peak surface and peak bulk electric fields.

DESCRIPTION OF THE PRIOR ART

The junctions of semiconductor devices have certain ideal breakdown voltages associated with them. In the case of the device formed by the simple p-n junction, the actual breakdown voltage falls short of the breakdown voltage which may ideally be achieved. Avalanche breakdown occurs in such a device at a voltage substantially less than the ideal breakdown voltage because excessively high electric fields are present at certain locations within the bulk of the device or because peak surface electric fields may be extremely high.

Semiconductor devices of the prior art have utilized various structures and methods to achieve an increase in the breakdown voltage of p-n junctions. A negative bevel has been mechanically ground on the surface of a semiconductor device such that it intersects the plane of the p-n junction at a small angle, generally between 2° and 12°. Such negative bevel semiconductor devices have been discussed in detail in the publication M. S. Adler, V. A. K. Temple, "A General Method for Predicting the Avalanche Breakdown Voltage of Negative Bevelled Devices", IEEE Transactions on Electron Devices, Vol. ED-23, No. 8, pages 956–960 (1976). A significant improvement in breakdown voltage is achieved using this approach; however, much surface area of the active devices is disadvantageously consumed.

In planar devices, it is known that junction curvature reduces the breakdown voltage of the device including a p-n junction. One or more floating field limiting rings may be placed at appropriate positions in the semiconductor device to reduce the effects of junction curvature and lower the surface electric field significantly, resulting in an increase in the breakdown voltage of the device. This approach is discussed in the publication M. S. Adler, V. A. K. Temple, A. P. Ferro and R. C. Rustay, "Theory and Breakdown Voltage for Planar Devices With a Single Field Limiting Ring", IEEE Transactions on Electron Devices, Vol. ED-24, No. 2, pages 107 to 113 (1977). However, the ideal junction breakdown voltage is not achieved using this approach.

In plane and planar devices, portions of semiconductor material on the heavily doped side of the junction have been partially etched away to force the depletion region on the heavily doped side to spread out. Thus, the surface and bulk electric fields of the device are reduced and breakdown voltage is correspondingly increased. This approach is disclosed in the publication V. A. K. Temple and M. S. Adler, "The Theory and Application of a Simple Etch Contour for Near Ideal Breakdown Voltage in Plane and Planar P-N Junction Devices", IEEE Transactions on Electron Devices, Vo. ED-23, No. 8, pages 950–955 (1976). The depth of this etched away region must be precisely controlled in order to achieve the exact desired charge distribution in the junction depletion region such that near ideal device breakdown voltage is obtained. Present etching techniques do not allow such precise etch depth control, thus rendering this depletion etch structure difficult to fabricate.

The above mentioned semiconductor devices of the prior art either fail to achieve near ideal device breakdown voltage or are difficult to fabricate. The present invention concerns a high breakdown voltage semiconductor device utilizing a junction extension region which is easily fabricated. It should be apparent to those skilled in the art that improved electronic performance is to be gained by such an easily fabricated high voltage semiconductor device including a high avalanche breakdown voltage p-n junction.

It is one object of this invention to provide a semiconductor device which includes at least one p-n junction with an avalanche breakdown voltage approaching the value of the ideal device breakdown voltage.

It is a further object of this invention to provide a semiconductor device including at least one p-n junction with both low peak surface electric fields and peak bulk electric fields.

Another object of this invention is to provide a semiconductor device including a p-n junction with high breakdown voltage which may be easily fabricated.

These and other objects of the invention become apparent to those skilled in the art upon consideration of the following description of the invention.

BRIEF SUMMARY OF THE INVENTION

The present invention is directed toward achieving low peak surface and peak bulk electric fields and high breakdown voltage, in any semiconductor device containing a p-n junction. For purposes of discussion, the invention will first be described as it pertains to increasing the breakdown voltage of a simple p-n junction; however, the invention may be applied to any semiconductor device containing a p-n junction to increase its breakdown voltage. A typical p-n junction device may have two regions of opposite type conductivity semiconductor material in contact with each other, that is, a lightly doped side and a heavily doped side with a junction formed therebetween. To accomplish the goal of increasing the avalanche breakdown voltage of this p-n structure, a junction extension region of semiconductor material of the same conductivity type as the heavily doped side of the device is situated in one of a plurality of selected positions within the device in order to control the shape and extent of the depletion layer on one side of the junction. The charge present in this junction extension region when it is depleted under junction reverse bias conditions is precisely controlled and this region is selectively positioned to shape the depletion region and control the distribution of electric field lines in the device. This results in low peak bulk and peak surface electric fields and high device breakdown voltage.

In accordance with one preferred embodiment of the invention, a semiconductor device containing at least one p-n junction is provided which includes a first region of semiconductor material of selected conductivity type having top and bottom surfaces of a predetermined length and a side surface. A second region of semiconductor material of conductivity type opposite that of the first region is located extending downward from a portion of the top surface of the first region. This second region includes upper and lower surfaces. A p-n junction is situated at the interface between the first and second regions. A junction termination is formed at the intersection of the junction with the upper surface of the second region. To increase the breakdown voltage of this junction, the semiconductor device is provided with a junction extension region of semiconductor material of the same conductivity type as the second region. This junction extension region has a greater lateral extent than thickness and is located proximate to the junction termination and oriented approximately parallel to the major plane of the junction. The thickness of this junction extension region is less than the thickness of the second region. A substantial portion of the junction extension region is situated between the junction termination and the side surface of the first region. This junction extension region may be located at or below the top surface of the first region or above the top surface and in contact with it.

In another embodiment of the invention, a semiconductor device including at least one p-n junction is provided which includes a first region of semiconductor material of selected conductivity type including top and bottom surfaces. A second region of semiconductor material of conductivity type opposite that of the conductivity type of the first region and having upper and lower surfaces is situated atop the first region. The lower surface of the second region is coextensive and contiguous with the top surface of the first region. The first and second regions include an open region in which semiconductor material has been removed. This open region extends from a portion of the upper surface downward through the second region and into a portion of the first region. The boundary of the open region with the semiconductor device forms part of an exposed surface. The upper surface of said second region forms the remainder of this exposed surface. A p-n junction is situated between the first and second regions and a junction termination is formed at the intersection of this p-n junction with the exposed surface. To enable this semiconductor device to achieve a high breakdown voltage, a junction extension region of semiconductor material of conductivity type the same as the conductivity type of the second region and having greater lateral extent than thickness is situated in the device. A portion of this junction extension region is located in the proximity of the junction termination. This junction extension region is oriented approximately parallel to, and following the contour of, the exposed surface. A substantial portion of the junction extension region is situated in the first region below the open region or overlaying the portion of the exposed surface bounding on the first region.

In accordance with another preferred embodiment of the invention, a plane semiconductor device including at least one p-n junction is provided which includes a first region of semiconductor material of a selected conductivity type which includes top and bottom surfaces. A second region of semiconductor material of conductivity type opposite that of said first region including upper and lower surfaces is situated atop the first region. The lower surface of the second region is coextensive and contiguous with the top surface of the first region. A p-n junction is formed between the first and second regions. Further, the first and second regions include a common edge side surface. A portion of this common edge side surface is beveled so as to pass through the entire thickness of the second region and a portion of the thickness of the first region. This beveled surface is oriented at a small acute angle with respect to the plane of the p-n junction. A junction termination is located at the intersection of the p-n junction with the beveled surface. To enable the semiconductor device to exhibit a high breakdown voltage, the device is provided with a junction extension region of semiconductor material of a conductivity type the same as that of the second region. This junction extension region has a greater length than thickness and its length is less than the length of the beveled surface. The junction extension region is located in the proximity of the beveled surface and oriented approximately parallel thereto with a substantial portion of the junction extension region being located within the first region or overlaying the portion of the beveled surface bounding on the first region.

The features of the invention believed to be novel are set forth with particularity in the appended claims. The invention, itself, however, both as to organization and method of operation, together with further objects and advantages thereof, may best be understood by reference to the following description taken in conjunction with the accompanying drawings.

DESCRIPTION OF THE DRAWINGS

FIG. 15 shows a side sectional view of another embodiment of the semiconductor device of the present invention, showing a portion of a plane device including an open region and showing a portion of a p-n junction with a junction extension region located in the first region in contact with the exposed surface and overlapping a portion of the second region.

FIG. 16 illustrates yet a further embodiment of the semiconductor device of the present invention showing a portion of a plane device with an open region and showing a portion of a p-n junction with a junction extension region located in the first region in contact with the exposed surface and overlapping a portion of the second region.

FIG. 17 shows another embodiment of the semiconductor device of the invention showing a portion of a plane device with an open region and showing a portion of a p-n junction with junction extension region located entirely within the first region below the open region and in contact with the exposed surface.

FIG. 18 illustrates a further embodiment of the semiconductor device of the invention showing a portion of a plane device with an open region and showing a portion of a p-n junction with a junction extension region situated in the open region overlaying a portion of the exposed surface of the first region and abutting the junction termination.

FIG. 19 shows another embodiment of the invention showing a portion of a plane device with an open region and showing a portion of a p-n junction with a junction extension region situated overlaying a portion of the exposed surface of the first and second regions.

FIG. 20 illustrates a further embodiment of the semiconductor device of the present invention showing a portion of a plane device including an open region and showing a portion of a p-n junction with a junction extension region situated overlaying a portion of the exposed surface of the first region.

FIG. 21 shows another embodiment of the invention showing a portion of a plane device including an open region which extends partially through the second region and showing a portion of a p-n junction with a junction extension region located in the first region below the open region.

FIG. 22 illustrates a further embodiment of the invention showing a portion of a palne device similar to that shown in FIG. 21 but showing a portion of a p-n junction with the junction extension region located within the first and second regions below the open region.

FIG. 23 illustrates a further embodiment of the invention showing a portion of a plane device similar to that of FIG. 21 but showing a portion of a p-n junction with the junction extension region situated overlaying a portion of the exposed surface of the open region.

FIG. 24 shows another embodiment of the semiconductor device of the present invention with a beveled edge side surface showing a portion of a p-n junction with a junction extension region located within the first region below the beveled surface and abutting the p-n junction.

FIG. 25 shows another embodiment of the invention similar to that of FIG. 24 but showing a portion of a p-n junction with a junction extension region situated below the beveled surface within the first region and overlapping the second region.

FIG. 26 illustrates a further embodiment of the semiconductor device of the invention similar to that shown in FIG. 24 but showing a portion of a p-n junction with a junction extension region situated within the first region below the beveled surface.

FIG. 27 shows a further embodiment of the invention similar to that shown in FIG. 24 but showing a portion of a p-n junction with a junction extension region situated in the first region in contact with the beveled surface and abutting the p-n junction.

FIG. 28 illustrates a further embodiment of the invention similar to that shown in FIG. 24 but showing a portion of a p-n junction with a junction extension region situated below the beveled surface in the first region and overlapping into the second region.

FIG. 29 shows another embodiment of the invention similar to that shown in FIG. 24 but showing a portion of a p-n junction with a junction extension region situated in the first region below the beveled surface.

FIG. 30 shows another embodiment of the invention similar to that shown in FIG. 24 but showing a portion of a p-n junction with a junction extension region situated overlaying the beveled surface of the first region and abutting the junction termination.

FIG. 31 illustraes yet a further embodiment of the invention similar to that shown in FIG. 24 but showing a portion of a p-n junction with a junction extention region situated overlaying the beveled surface of the first region and a portion of the beveled surface of the second region.

FIG. 32 shows another embodiment of the invention similar to that shown in FIG. 24 but shwoing a portion of a p-n junction with a junction extension region situated overlaying a portion of the beveled surface of the first region.

DETAILED DESCRIPTION OF THE PREFERRED EMBODIMENTS

Figure 1:
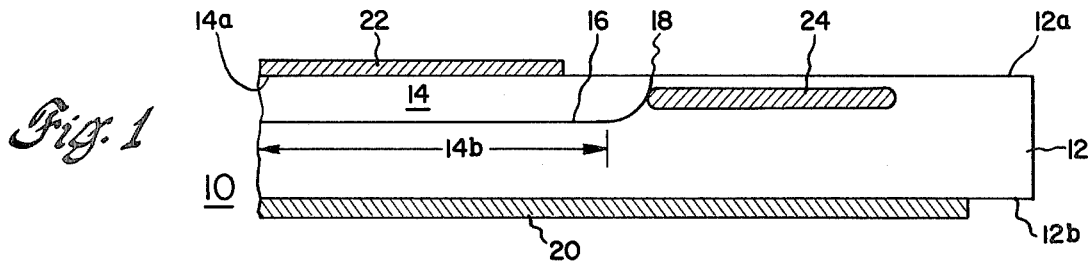
FIG. 1 is a side sectional view of the semiconductor device of the present invention, showing a portion of a p-n junction with a junction extension region located within the first region and abutting a p-n junction.

FIG. 1 illustrates a portion of a high breakdown voltage semiconductor device incorporating the invention to form a device 10 containing at least one p-n junction with high breakdown voltage. Device 10 includes a first region 12 of semiconductor material having a selected conductivity type. Region 12 is the lightly doped region of device 10 and includes top and bottom surfaces 12a and 12b respectively and further includes side surface 12c. A heavily doped semiconductor second region 14 of conductivity type opposite that of region 12 is situated within region 12 extending downward from a portion of top surface 12a to a depth less than the length of side surface 12c. Device 10 is thus a planar semiconductor device. Region 14 includes an upper surface 14a and a lower surface 14b as shown in FIG. 1. A p-n junction 16 is located between region 12 and region 14. Device 10 further includes a junction termination 18 which is defined by the intersection of junction 16 with top surface 12a and upper surface 14a. An electrical contact 20 is attached to bottom surface 12b and an electrical contact 22 is attached to upper surface 14a to provide a means for connecting semiconductor device 10 to external electrical circuitry.

A junction extension region 24 having a greater lateral extent than thickness and comprised of a semiconductor material of the same conductivity type as region 14 is situated in semiconductor device 10 at a position proximate to junction termination 18 and typically above the plane of lower surface 14b and below the plane of upper surface 14a of second region 14. Junction extension region 24 abuts p-n junction 16. Further, junction extension region 24 is oriented approximately parallel to the major plane of p-n junction 16. (The major plane of junction 16 corresponds to lower surface 14b of region 14). In all of the embodiments of the invention to be set forth in the following discussion, the junction extension region is oriented approximately parallel to the plane of the p-n junction. The junction extension region 24 of device 10 may, alternatively, extend below the plane formed by surface 14b, provided the distance between the junction extension region 24 and bottom surface 12b is sufficient such that device "punch through" does not occur.

Junction extension region 24 functions to reduce the peak bulk and peak surface electric fields and to increase the avalanche breakdown voltage of the p-n junction of semiconductor device 10 to near its ideal value. For purposes of discussion an ideal p-n junction will be defined as that junction formed between two parallel layers of semiconductor material in contact with each other the length of the layers extending to infinity. In such an ideal case there are no surface effects to be accounted for. $V_{id}$ is defined as the avalanche breakdown voltage of this ideal junction. The breakdown voltage of a p-n junction in actual physically realizable semiconductor devices generally is substantially smaller than $V_{id}$.

When the ideal p-n junction 16 is reverse biased, a depletion region is formed around the p-n junction 16. $Q_{id}$ is defined as the ideal charge per unit area present in the depletion region of this ideal junction when $V_{id}$ is applied to the junction. $W_{id}$ is defined as the depletion width of the lightly doped side of the junction under the above described ideal conditions. $W_{JER}$ is defined as the length of the junction extension region, that is, the distance along its lateral extent parallel to the major plane of junction 16.

When the junction extension region of the invention, such as region 24, is provided to an actual semiconductor device containing at least one p-n junction the avalanche breakdown voltage of the junction approaches $V_{id}$. The term $Q_{JER}$ is defined herein as the amount of charge per unit area in the junction extension region when fully depleted. It has been found that careful control of $Q_{JER}$, the charge concentration per unit area present within the junction extension region measured when depleted as well as its lateral extent $W_{JER}$ not only allows for the creation of a device with a p-n junction of breakdown voltage approaching $V_{id}$, the ideal case, but also by proper selection of $Q_{JER}$, peak bulk and peak surface electric fields of the device may be reduced to optimal values.

Lower values of $Q_{JER}$ desirably result in higher p-n junction breakdown voltages and in lower values of peak surface electric fields. However, lower values of $Q_{JER}$ result in higher peak bulk electric field in the junction region. In accordance with the invention, best results are achieved when $Q_{JER} = 0.6$ to $0.9$ $Q_{id}$ although values as low as approximately $0.2$ $Q_{id}$ and as high as approximately $1.5$ $Q_{id}$ will yield improved device performance. For $Q_{JER}$ values within this preferred range, the breakdown voltage of the junction approaches $V_{id}$ and further, both the surface and bulk electric fields are reduced as compared to a p-n junction without a junction extension region. A similar charge concentration range was found by V. A. K. Temple and M. S. Adler and set forth in their publication, "The Theory and Application of a Simple Etch Contour for Near Ideal Breakdown Voltage in Plane and Planar P-N Junction Devices", IEEE Transactions on Electron Devices, Vol. ED-23, No. 8, pages 950-955 (1976) which dealt with an approach that attempted to control the charge concentration in the junction region by an etched technique alone.

Figure 2:
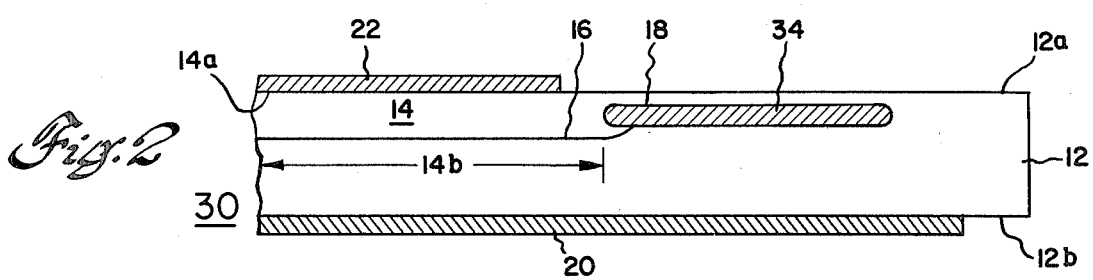
FIG. 2 is a side sectional view of another embodiment of the semiconductor device of the present invention, showing a portion of a p-n junction with a junction extension region located within the first region and overlapping a portion of the second region.

The width of the junction extension region is another important parameter which must be controlled in order to achieve most effective peak surface field reduction and increase of device breakdown voltage. It has been found that $W_{JER}$ should be approximately equal to, or greater than $\frac{1}{2}$ $W_{id}$. Values of $W_{JER}$ less than $\frac{1}{2}$ $W_{id}$ will still allow the device to function although performance will be degraded the smaller $W_{JER}$ becomes, that is, the breakdown voltage of the p-n junction provided with the junction extension region will now be as high as it would for higher values of $W_{JER}$. $W_{JER}$ may be greater than $\frac{1}{2}$ $W_{id}$, but values in excess of 2 $W_{id}$ do not result in significant improvement of device performance beyond that achieved with smaller values of $W_{JER}$. $W_{JER}$ values in excess of 2 $W_{id}$ tend to result in devices with an unnecessarily large surface area although they function well. The junction extension region may overlap region 14 as shown in FIG. 2 depicting device 30. Device 30 is similar in function and structure in all respects to device 10 of FIG. 1 except for the positioning of junction extension region 34. Only the portion of junction extension region 34 which is located within the first region 12 is effective in achieving high p-n junction breakdown voltage and reduced peak bulk and peak surface electric fields. Thus, that portion of $W_{JER}$ within the first region of device 30 must have a length greater than approximately $\frac{1}{2}$ $W_{id}$.

Figure 3:
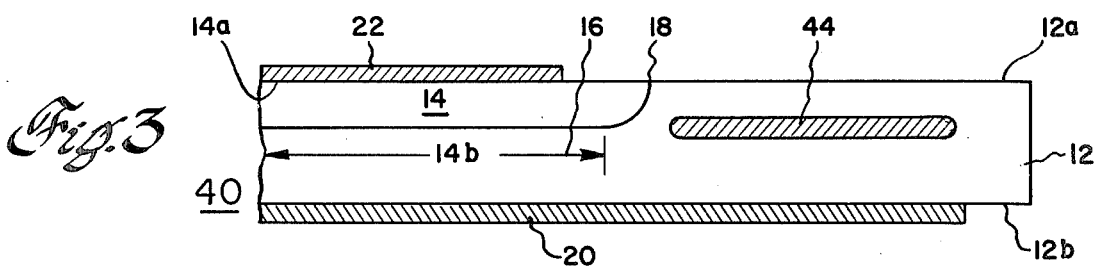
FIG. 3 is a side sectional view of a further embodiment of the semiconductor device of the invention, showing a portion of a p-n junction with a junction extension region located entirely within the first region.

Another embodiment of the present invention is possible in which the junction extension region neither overlaps the second region nor abuts upon it. Such an embodiment is shown in FIG. 3 as device 40 which contains a p-n junction 16 and a junction extension region 44. Device 40 is similar in structure and function to device 10 of FIG. 1 except for the location of junction extension region 44. Junction extension region 44 is situated "electrically floating" within region 12. Electrically floating is defined to mean located within the device but not connected to one of the electrical contacts (i.e. electrodes) of the device. More specifically, junction extension region 44 is situated above the plane formed by lower surface 14b and below the plane formed by upper surface 14a. Thus, in this embodiment junction extension region 44 does not overlap or abut region 14; however, in order to function effectively a portion of junction extension region 44 should be within a distance of approximately $\frac{1}{4} W_{id}$ or less from the junction termination. This requirement applies for all of the various embodiments of the invention. The distance between the junction extension region and the junction termination may exceed $\frac{1}{4} W_{id}$ and the device will still function; however, device performance in terms of increased breakdown voltage becomes increasingly degraded the more this distance exceeds $W_{id}/4$. As in the case of the two embodiments of the invention previously discussed, this embodiment and those to be described in the discussion to follow must have a junction extension region whose width $W_{JER}$ is approximately equal to or greater than $\frac{1}{2} W_{id}$. In the embodiments where the junction extension region overlaps region 14, the portion of the junction extension region within region 12 must have a length approximately equal to or greater than $\frac{1}{2} W_{id}$.

Figure 4:
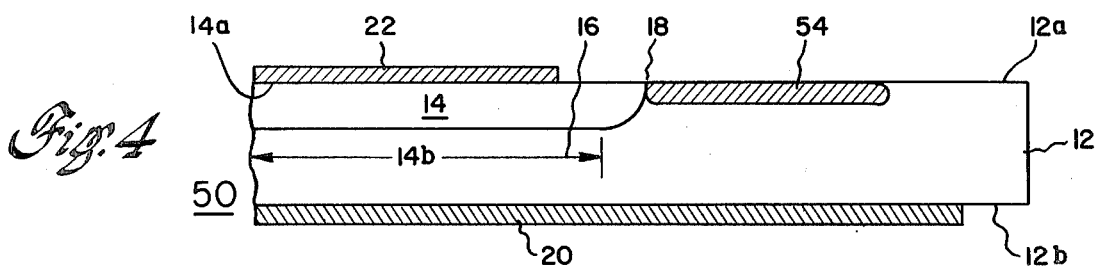
FIG. 4 is yet another embodiment of the semiconductor device of the invention, showing a portion of a p-n junction with a junction extension region situated within the first region at the top surface and abutting a p-n junction.

FIG. 4 shows a portion of a semiconductor device including a p-n junction 16 as device 50 including a junction extension region 54. Semiconductor device 50 is similar in structure and function to semiconductor device 10 of FIG. 1 except for the location of junction extension region 54. Junction extension region 54 is situated in region 12 in contact with a portion of top surface 12a and in abutment with junction termination 18.

Figure 5:
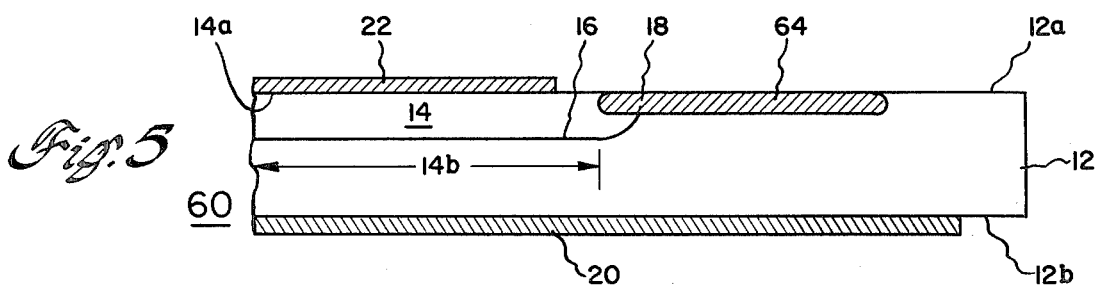
FIG. 5 is a side sectional view of another embodiment of the semiconductor device of the invention, showing a portion of a p-n junction with a junction extension region situated in contact with the top surface of the first region and the upper surface of the second region extending from within the first region and overlapping the second region.

In FIG. 5 another embodiment of a semiconductor device of the invention including at least one p-n junction 16 is shown as device 60 which is similar in structure and function in all respects to device 50 of FIG. 4 except for the positioning of junction extension region 64. Junction extension region 64 is situated within region 12 and in contact with top surface 12a. Junction extension region 64 further overlaps a portion of region 14 and is in contact with upper surface 14a for that portion.

Figure 6:
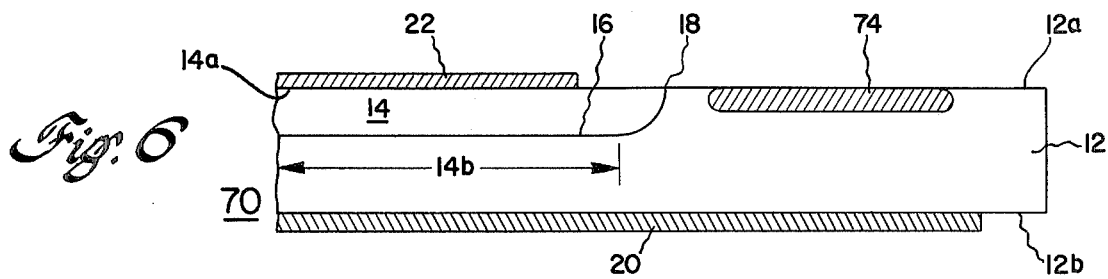
FIG. 6 is yet a further embodiment of the semiconductor device of the invention, showing a portion of a p-n junction with a junction extension region located entirely within the first region and in contact with the top surface.

Another embodiment of the invention is shown in FIG. 6 as device 70 which is similar in structure and function in all respects to device 50 of FIG. 4 except that the junction extension region 74 is situated "floating" within region 12 and in contact with top surface 12a. Thus, in this embodiment of the invention, junction extension region 74 is separated from junction termination 18. However, in order for junction extension region 74 to function effectively the distance between the junction termination 18 and junction extension region 74 must be less than approximately $\frac{1}{4} W_{id}$.

Figure 7:
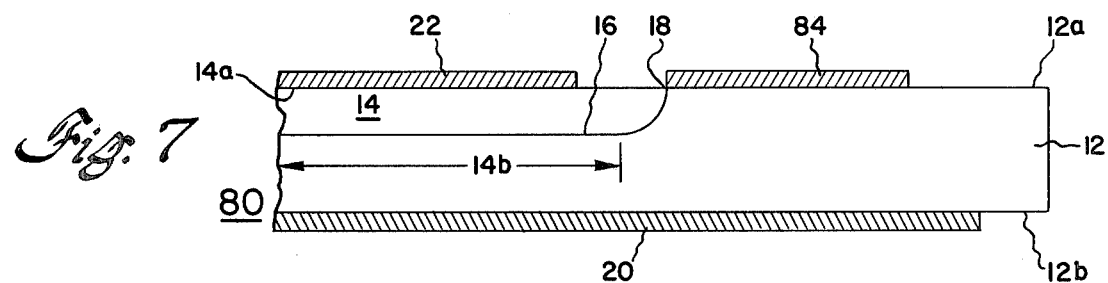
FIG. 7 is a side sectional view of another embodiment of the semiconductor device of the present invention, showing a portion of a p-n junction with a junction extension region situated overlaying a portion of the top surface of the first region and abutting the junction termination.

In FIG. 7 another embodiment of the semiconductor device of the invention including at least one p-n junction 16 is shown as device 80 which is similar in structure and function in all respects to device 10 of FIG. 1 except for the location of junction extension region 84. The junction extension region of the invention need not be located within regions 12 and 14. Rather, the junction extension region may be situated overlaying top surface 12a or a portion thereof, and further overlaying a portion of upper surface 14a. More specifically, the embodiment of the invention shown in FIG. 7 shows a device 80 with a junction extension region 84 situated overlaying a portion of top surface 12a and in abutment with junction termination 18.

Figure 8:
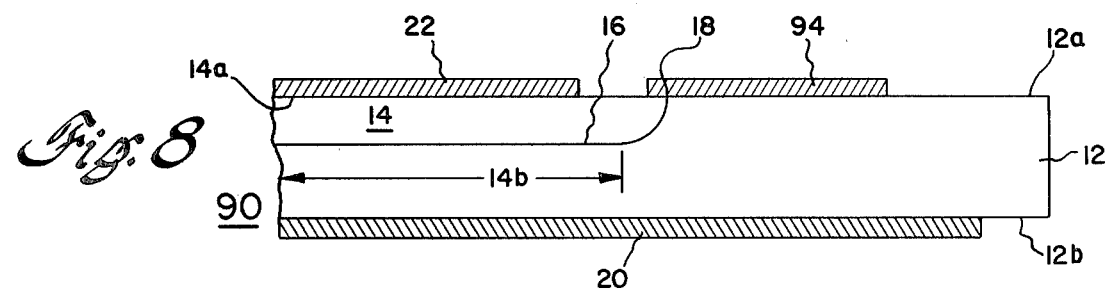
FIG. 8 shows a side sectional view of a further embodiment of the semiconductor device of the invention, showing a portion of a p-n junction with a junction extension region overlaying a portion of the top surface of the first region and a portion of the upper surface of the second region.

Another embodiment of the present invention is shown in FIG. 8 as a portion of semiconductor device 90 including at least one p-n junction with a junction extension region 94. Device 90 is similar in structure and function to device 80 of FIG. 7 except for the location of junction extension region 94. Junction extension region 94 is situated overlaying top surface 12a or a portion thereof and further overlaying a portion of upper surface 12a.

Figure 9:
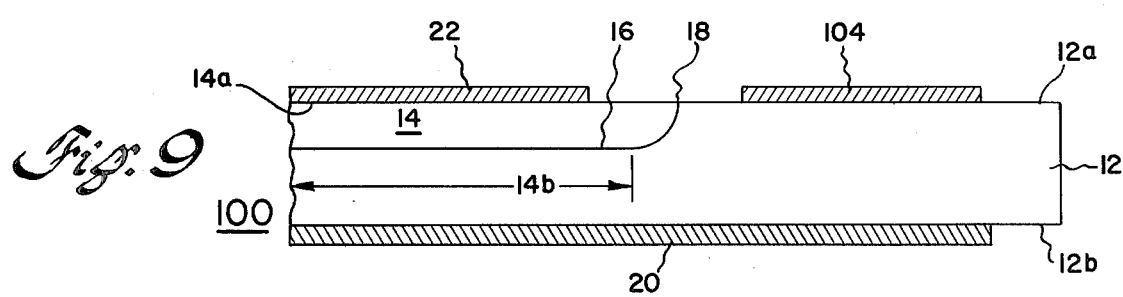
FIG. 9 is a side sectional view of another embodiment of the semiconductor device of the present invention, showing a portion of a p-n junction with a junction extension region located overlaying a portion of the top surface of the first region.

Another possible embodiment of the invention is illustrated in FIG. 9 as device 100 which includes at least one p-n junction 16 with a junction extension region 104 located "floating" on surface 12a. More specifically, device 100 is similar in structure and function in all respects to device 80 of FIG. 7 except for the location of junction extension region 104. Junction extension region 104 is situated overlaying a portion of top surface 12a and separated from junction termination 18 by a certain distance. In order for junction extension region 104 to function effectively, this distance should be less than approximately $\frac{1}{4} W_{id}$.

Junction extension regions 24, 34, 44, 54, 64, and 74 in FIGS. 1-6 may be created by ion implantation and subsequent activation which may be followed by diffusion. Junction extension regions 84, 94 and 104 in FIGS. 7-9 may be created by epitaxial growth.

Figure 10:
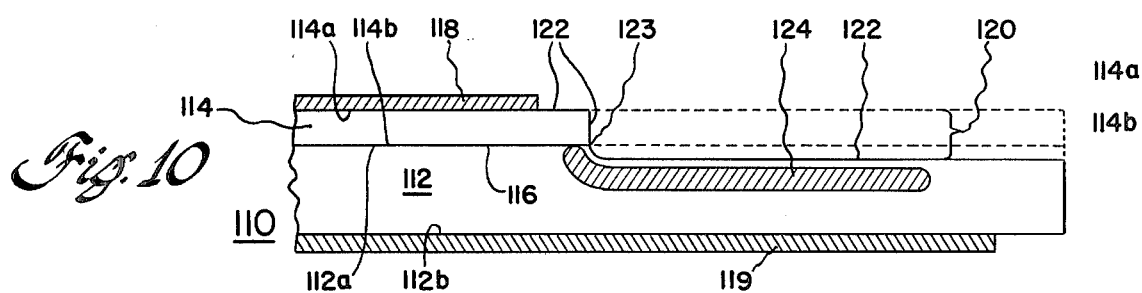
FIG. 10 illustrates a side sectional view of the semiconductor device of the invention, showing a portion of a plane device with an open region and showing a portion of a p-n junction with a junction extension region situated within the first region below the exposed surface and abutting the p-n junction.
Figure 10A:
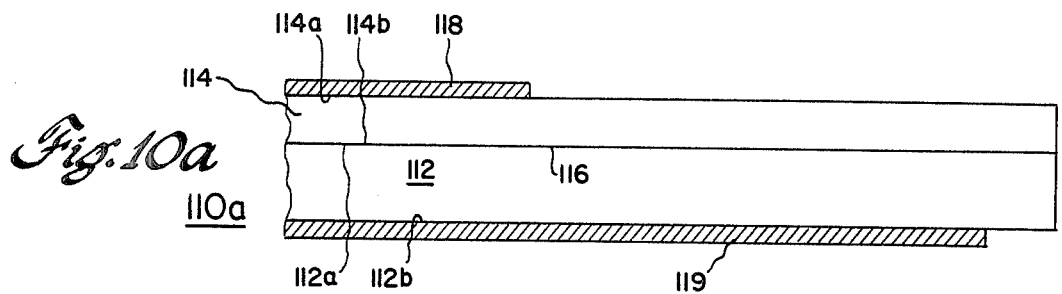
FIG. 10a shows the semiconductor device of FIG. 10 before the open region is provided to the device.

Another basic embodiment of the semiconductor device of the present invention containing at least one p-n junction is shown in FIG. 10 including an open region in which semiconductor material has been removed. More specifically, FIG. 10 shows device 110 including region 112 of semiconductor material of a selected conductivity type including top surface 112a and bottom surface 112b. A region 114 of semiconductor material of conductivity type opposite that of the conductivity type of region 112 is situated atop region 112. Region 114 includes upper surface 114a and lower surface 114b. Lower surface 114b is coextensive and contiguous with top surface 112a. Region 114 is heavily doped compared to region 112. Regions 112 and 114 include an open region 120 wherein semiconductor material has been removed. FIG. 10a shows device 110 as it would appear before open region 120 is provided to device 110. Open region 120 extends downward from a portion of upper surface 114a through region 114 and into a portion of region 112 as illustrated in FIG. 10. The shape of open region 120 is not critical. Its shape may be such as that shown in FIG. 10 in which the open region has a curved contour near junction termination 123. The open region could also, for example, have a right angle or a straight angle junction termination 123. The boundary of open region 120 with semiconductor device 110 forms part of exposed surface 122. The portion of upper surface 114a not consumed by open region 120 comprises the remainder of exposed surface 122. The dashed lines within the open region 120 show the location of the surfaces of portions of regions 112 and 114 prior to removal of the appropriate portions described above to form open region 120. Device 110 further includes a p-n junction 116 situated between regions 112 and 114. Upper surface 114a and bottom surface 112b are respectively provided with electrical contacts 118 and 119 to facilitate connection of device 110 to external electrical circuitry. A junction termination 123 is formed at the intersection of junction 116 with the portion of exposed surface 112 bordering upon open region 120.

Device 110 is provided with a junction extension region 124 of semiconductor material of conductivity type the same as the conductivity type of region 114. Junction extension region 124 is situated within region 112 below the portion of exposed surface 122 bordering on open region 120 and is oriented approximately parallel to and following the contour of this portion of exposed surface 122. As shown in FIG. 10, junction extension region 124 is further oriented generally parallel to the plane of junction 116 with a portion of junction extension region 124 abutting junction 116. (The junction of extension regions of further embodiments of the invention similar to device 110 are likewise oriented approximately parallel to the plane of the p-n junction.)

To function effectively, some portion of junction extension region 124 must be located at a distance less than approximately $\frac{1}{4}$ $W_{id}$ from junction termination 123. Further, the length of junction extension region 124 $W_{JER}$, measured perpendicular from junction termination 123 toward open region 120 in a plane parallel to p-n junction 116 should be equal to or greater than approximately $\frac{1}{2}$ $W_{id}$. Both of the requirements set forth in this paragraph apply to further embodiments of the invention similar to device 110 which will be described in the following discussion.

Figure 11:
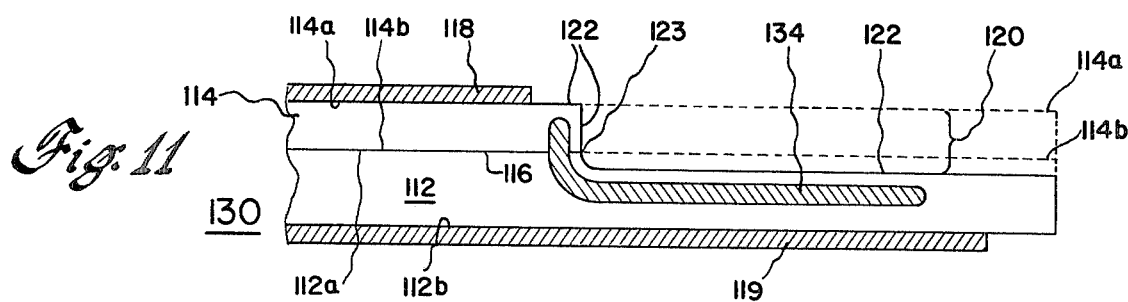
FIG. 11 is a side sectional view of another embodiment of the semiconductor device of the invention showing a portion of a plane device with an open region and showing a portion of a p-n junction with a junction extension region located within the first region below the exposed surface and overlapping a portion of the second region.

Another embodiment of the semiconductor device of the invention including at least one p-n junction is illustrated in FIG. 11 as device 130. Device 130 is similar in structure and function to device 110 of FIG. 10 except for the location of junction extension region 134. Junction extension region 134 is situated within region 112 and 114 and oriented approximately parallel to the portion of exposed surface 112 bounding upon open region 120. Device 130 differs from device 110 in that in device 110, the entirety of junction extension region 124 is included within region 112; however, in device 130, a substantial portion of junction extension region 134 is included within region 112 and a further portion overlaps into region 114. As in all the other embodiments of the invention where the junction extension region overlaps into region 114, this overlapping portion of the junction extension region generally does not contribute to increased device performance. However, such embodiments tend to be easier to fabricate and the overlapping portion of junction extension region 134 does not significantly degrade device performance.

Figure 12:
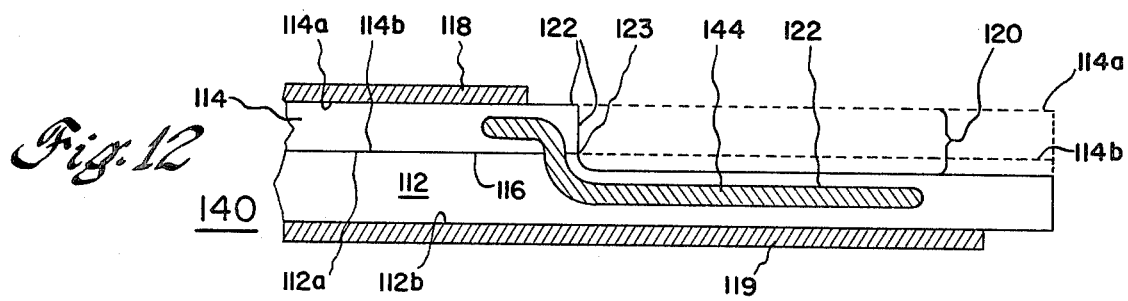
FIG. 12 illustrates another embodiment of the semiconductor device of the present invention showing a portion of a plane device with an open region and showing a portion of a p-n junction with a junction extension region situated below the exposed surface of the first region and overlapping a portion of the second region.

Another embodiment of the semiconductor device of the invention including at least one p-n junction is illustrated in FIG. 12 as device 140. Device 140 is similar in structure and function to device 110 of FIG. 10 except for the location of junction extension region 144. Junction extension region 144 is situated within regions 112 and 114 below a portion of exposed surface 122 and oriented approximately parallel thereto. Junction extension region 144 of device 140 differs from junction extension region 124 of device 110 in that junction extension region 144 not only is located within region 112 but further overlaps into region 114 as illustrated to a greater extent than does junction extension region 134.

Figure 13:
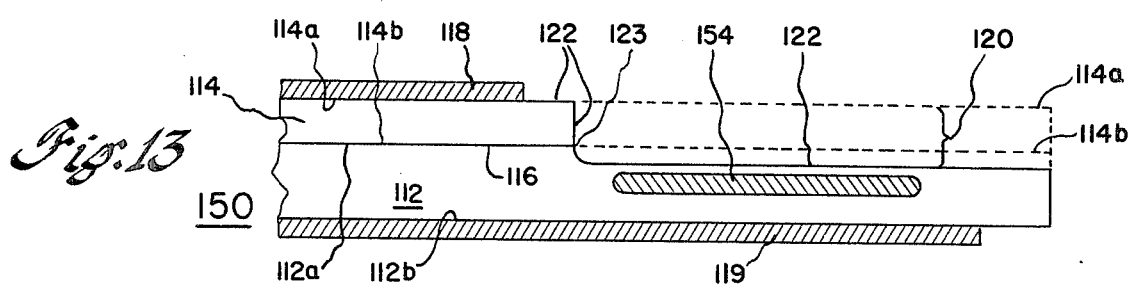
FIG. 13 illustrates a side sectional view of another embodiment of the semiconductor device of the present invention showing a portion of a plane device including an open region and showing a portion of a p-n junction with a junction extension region situated entirely within the first region below the open region.

FIG. 13 illustrates another embodiment of the semiconductor device of the invention including at least one p-n junction as device 150. Device 150 is similar in structure and function to device 110 of FIG. 10 except for the location of junction extension region 154. Junction extension region 154 is situated within region 112 below the portion of exposed surface 122 bordering on region 112 and oriented approximately parallel thereto. Device 150 of FIG. 13 differs from device 110 in that junction extension region 154 is separated from junction 116 by a certain distance. As disclosed above, a portion of the junction extension region must be located within a distance of approximately $\frac{1}{4}$ $W_{id}$ or less from junction termination 123.

Figure 14:
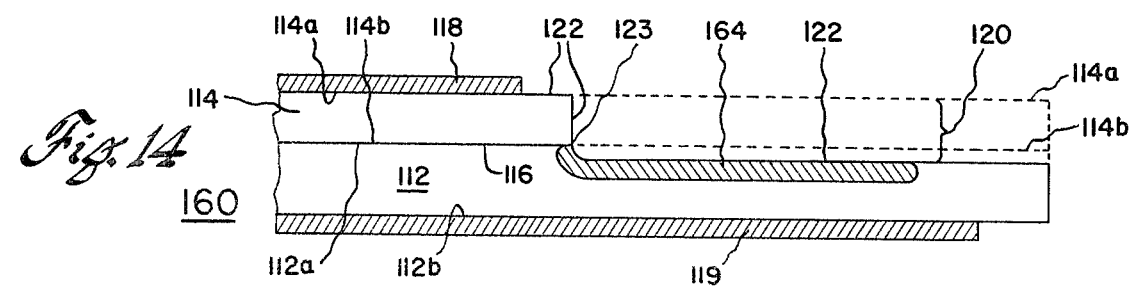
FIG. 14 shows a side sectional view of yet a further embodiment of the invention showing a portion of a plane device including an open region and showing a portion of a p-n junction with a junction extension region located within the first region below the exposed surface and in contact therewith and abutting the p-n junction.

FIG. 14 shows another embodiment of the semiconductor device of the invention including at least one p-n junction as device 160. Device 160 is similar in structure and function to device 110 of FIG. 10 except for the location of junction extension region 164. Junction extension region 164 is situated within region 112 and in contact with the portion of exposed surface 122 bounding upon region 112. Junction extension region 164 is oriented approximately parallel to this portion of exposed surface 122. Further, junction extension region 164 abuts junction termination 123.

Another embodiment of the semiconductor device of the invention including at least one p-n junction is shown in FIG. 15 as device 170 which is similar in structure and function to device 160 described above except for the location of junction extension region 174. Junction extension region 174 is situated within regions 112 and 114 in contact with a portion of exposed surface 122 bounding upon open region 120 and oriented approximately parallel thereto. Junction extension region 174 differs from junction extension region 164 in that region 174 overlaps into region 114.

FIG. 16 shows another embodiment of a semiconductor device including at least one p-n junction as device 180. Device 180 is similar in structure and function to device 160 described above in FIG. 14 except for the location of junction extension region 184. Junction extension region 184 is situated within regions 112 and 114 in contact with a portion of exposed surface 122 and oriented approximately parallel thereto. Junction extension region 184 differs from junction extension region 164 in that region 184 extends from region 112 overlapping into region 114 in contact with a portion of exposed surface 122 bounding on open region 120 and also in contact with the portion of exposed surface 122 comprised of upper surface 114a.

Another embodiment of the semiconductor device of the invention including at least one p-n junction is illustrated in FIG. 17 as device 190. Device 190 is similar in structure and function to device 160 of FIG. 14 except for the location of junction extension region 194. Junction extension region 194 is situated within region 112 below open region 120 and in contact with a portion of exposed surface 122 bounding on region 112 and oriented approximately parallel thereto. Junction extension region 194 differs from junction extension region 164 of FIG. 14 in that region 194 is separated from junction termination 123.

A further embodiment of the present invention is shown as semiconductor device 200 including at least one p-n junction in FIG. 18. Device 200 is similar in structure and function to device 110 of FIG. 10 except for the location of junction extension region 204. Junction extension region 204 is situated overlaying a portion of exposed surface 122 bounding upon region 112 and oriented approximately parallel to the plane of p-n junction 116. Junction extension region 204 abuts junction termination 123. As shown in FIG. 18, junction extension region 204 contacts region 114 near junction termination 123.

Another embodiment of the semiconductor device of the invention including at least one p-n junction is illustrated in FIG. 19 as device 210. Device 210 is similar in structure and function to device 200 of FIG. 18 described immediately above except for the location of junction extension region 214. Junction extension region 214 is situated overlaying a portion of exposed surface 122 above regions 112 and 114. Junction extension region 214 differs from junction extension region 204 in that region 214 further extends overlaying the portion of exposed surface 122 bounding on region 114 and open region 120. Further, junction extension region 214 may overlay a portion of upper surface 114a.

FIG. 20 illustrates a further embodiment of the semiconductor device of the invention including at least one p-n junction as device 220. Device 220 is substantially similar in structure and function to device 210 of FIG. 19 described above except for the location of junction extension region 224. Junction extension region 224 is situated overlaying a portion of exposed surface 122 bounding on region 112. Region 224 is oriented approximately parallel to that portion and further is oriented approximately parallel to p-n junction 116. Junction extension region 224 is separated from junction termination 123. It should again be emphasized that in an embodiment such as this where the junction extension region is separated from the junction termination 123, a portion of the junction extension region must be situated at a distance not exceeding approximately $\frac{1}{4} W_{id}$ from junction termination 123.

Junction extension regions 124, 134, 144, 154, 164, 174, 184, and 194 in FIGS. 10–17 may be formed by ion implantation and subsequent activation which can be followed by diffusion. Junction extension regions 204, 214, and 224 in FIGS. 18–20 may be formed by epitaxial growth provided that with the device in final form the approximate $Q_{JER}$ is present.

Another basic embodiment of the semiconductor device of the invention including at least one p-n junction is set forth in FIG. 21 which illustrates a portion of a device 230. Semiconductor device 230 includes a region 232 of semiconductor material of a selected conductivity type including top and bottom surfaces, 232a and 232b, respectively. A region 234 of semiconductor material of conductivity type opposite that of the conductivity type of region 232 and having upper and lower surfaces, 234a and 234b, respectively, is situated atop region 232. Lower surface 234b is coextensive and contiguous with top surface 232a. Region 234 is heavily doped compared to region 232. Region 234 includes an open region 238 wherein semiconductor material has been removed. Dashed lines indicate surfaces of the device before open region 238 is formed. Open region 238 extends downward from a portion of upper surface 234a into region 234 to a sufficient depth such that the portion of region 234 remaining below open region 238 forms a narrow region 240 which contains a negligible effective electric charge when depleted. The boundary of open region 240 with semiconductor device 230 forms part of an exposed surface 247. The upper surface 234a forms the remainder of exposed surface 247. Semiconductor device 230 includes at least one p-n junction such as junction 236 formed between regions 232 and 234. A junction quasi-termination 242 is defined to be the situated location in junction 236 immediately adjacent to where region 234 narrows to form open region 238 and narrow region 240. Electrical contacts 246 and 248 are attached to bottom surface 232b and upper surface 234a, respectively, to facilitate connection of device 230 to external electrical circuitry.

A junction extension region of semiconductor material of the same conductivity type as region 234 and having a greater lateral extent than thickness is located within regions 232 and 234. The junction extension region may be specifically located in many different positions throughout the semiconductor device while still achieving the goal of increasing the breakdown voltage of a p-n junction within the device and obtaining low peak surface and peak bulk electric fields. More specifically, the junction extension region should be oriented approximately parallel and following the contour fo the exposed surface of a portion thereof. The junction extension region also should be generally parallel to the plane of the p-n junction. This applies to all embodiments which will be later discussed that are similar to device 230. It must be emphasized that a portion of the junction extension region should be located in the proximity of junction termination 242. (The phrase "in the proximity of" is hereby defined as meaning that a distance not exceeding approximately $\frac{1}{4} W_{id}$.) A substantial portion of the junction extension region is situated below region 238. Again, this applies to embodiments of the invention similar to device 230 which will be later discussed.

One selected position for junction extension region 244 results in embodiment 230 shown in FIG. 21. More specifically, junction extension region 244 of device 230 is situated within region 232 below open region 238 and is oriented approximately parallel to p-n junction 236. Junction extension region 244 is separated from junction termination 242. Although these two regions are separated, a portion of junction extension region 244 must still be "within the proximity of" junction quasi-termination 242 in order to achieve desired results.

Although not illustrated, further embodiments of the invention similar to that shown in FIG. 21 as device 230 are possible because of the various junction extension region geometries possible. For example, a semiconductor device similar in structure and function to device 230 may have a junction extension region similar to junction extension region 244 but which overlaps into region 234. This overlapping portion of the junction extension region may be oriented parallel to the portion of the exposed surface bordering upon open region 238 and may further extend and overlap into region 234 running parallel to the portion of exposed surface 247 which is comprised of upper surface 234a. A further embodiment of the invention results when a portion of a semiconductor device similar to that shown as device 230 of FIG. 21 includes a junction extension region similar to junction extension region 244 except a portion of this junction extension region is positioned abutting junction quasi-termination 242. Further embodiments can be achieved in which the junction extension region abuts junction 236 at various points provided these points are "in the proximity of" junction quasi-termination 242.

FIG. 22 shows another embodiment of the semiconductor device of the present invention including one p-n junction as device 250. Device 250 is similar in structure and function to device 230 described above under FIG. 21 except for the location of junction extension region 254. Junction extension region 254 is situated within regions 232 and 234 in contact with a portion of exposed surface 247 bordering on narrow region 240. Junction extension region 254 is oriented approximately parallel to p-n junction 236. Further, junction extension region 254 is separated from junction quasi-termination 242. Again, further embodiments of the semiconductor device of the invention are possible because of the various geometries which the junction extension region may assume. For example, a device similar to device 250 results when a junction extension region similar to region 254 abuts junction quasi-termination 242. A further embodiment is created where the junction extension region is situated within regions 232 and 234 in contact with the portion of exposed surface 247 bounding upon open regions 238 and oriented approximately parallel thereto. Yet another embodiment of the invention is created where the junction extension region of the device described immediately above further overlaps into region 234 and is situated extending below and in contact with a portion of upper surface 234a.

Another embodiment of the semiconductor device of the present invention is set forth in FIG. 23 as device 260 which includes at least one p-n junction. Device 260 is substantially similar in structure and function to device 230 described above in FIG. 21 except for the location of junction extension region 264. Junction extension region 264 is shown overlaying a portion of the exposed surface 247 bordering on the narrow region 240. Junction extension region 264 is separated from junction quasi-termination 242. Again, further embodiments of the semiconductor device of the invention are possible because of the many different geometries which the junction extension region may assume. For example, the junction extension region may be situated similar to that of junction extension region 264 but with a portion of the junction extension region abutting the portion of exposed surface 247 immediately above junction termination 242. In both of the preceding two embodiments, the junction extension region is oriented approximately parallel to the plane of the p-n junction. In fact, in all embodiments of the invention in FIGS. 1–23, the junction extension region is oriented generally parallel to the plane of the p-n junction. A further embodiment of the invention similar to that of device 260 is achieved where the junction extension region is situated overlaying a portion of exposed surface 247 below open region 238 and further overlaying a portion of upper surface 234a of region 234. In the above described embodiments of the invention similar to devices 230 and 250, the junction extension region may be created by ion implantation and subsequent activation which may be followed by diffusion. In embodiments similar to device 260, the junction extension region may be formed by epitaxial growth.

Another basic embodiment of the semiconductor device of the invention including at least one p-n junction is shown in FIG. 24 as device 270. Device 270 includes a region 272 of semiconductor material of a selected conductivity type including top and bottom surfaces, 272a and 272b, respectively. A region 274 of semiconductor material of conductivity type opposite that of region 272 including upper and lower surfaces, 274a and 274b, respectively, is situated atop region 272. Lower surface 274b is coextensive and contiguous with top surface 272a. Region 274 is heavily doped compared with region 272. A p-n junction 276 is situated between regions 272 and 274. Regions 272 and 274 have a common edge side surface, a portion 280 of which is beveled as shown in FIG. 24. Beveled surface 280 forms a portion of the outer surface of device 270 passing through the outer portion of the device comprised of the entire thickness of region 274 and a portion of the thickness of region 272. Beveled surface 280 is oriented at a small acute angle with respect to the plane of p-n junction 276. In the absence of the junction extension region, best results are achieved when this small acute angle is as small as possible. In a practical device angles within the range of approximately 2° to 12° are usable. A junction termination 282 is located at the intersection of junction 276 with beveled surface 280. Electrical contacts 284 and 286 are attached to bottom surface 272b and upper surface 274a, respectively, to facilitate connection of device 270 to external electrical circuitry. Similar to the embodiments of the invention already discussed, device 270 includes a junction extension region 288 which increases the breakdown voltage of a p-n junction 276 within the device while further achieving low peak surface and peak bulk electric fields. Providing device 270 with a beveled surface 280 results in removal of semiconductor material from regions 272 and 274 of the device in a manner analogous to that in which open region 120 accomplishes the same for device 110 of FIG. 10. The locations within the device at which the junction extension region may be positioned in order to achieve effective device functioning are similar to that of the embodiments already described.

The junction extension region is comprised of a semiconductor material of a conductivity type the same as the conductivity type of region 274. The junction extension region of this basic embodiment has a length greater than its thickness but less than the length of beveled surface 280. In general terms, the junction extension region is located in the proximity of beveled surface 280 and is oriented approximately parallel thereto. The junction extension region may be located under beveled surface 280 and in contact therewith, and also overlaying a portion of beveled surface 280 of region 274. A substantial portion of the junction extension region described above should be situated within region 272 or overlaying a portion of beveled surface 280 bordering upon region 272. More specifically, the width of the portion of the junction extension region which is within or overlaying region 272 should be approximately $\frac{1}{2} W_{id}$ or greater to achieve desired results.

Providing beveled semiconductor device 270 and similar embodiments of the invention with a junction extension region results in lower peak surface and peak bulk electric fields than would be achieved by this beveled device with the beveled surface alone without the junction extension region. Likewise, greater device breakdown voltage is achieved as compared to the beveled device without the junction extension region. By providing the beveled device with a junction extension region, device surface area may be conserved because the acute angle which beveled surface 280 forms with p-n junction 276 may be larger than that of the same device without a junction extension region.

As shown in FIG. 24, a portion of junction extension region 288 abuts junction 276. In this embodiment and all the following embodiments to be discussed which are similar to that of device 270, a portion of the junction extension region should be located within a distance of ¼ $W_{id}$ from junction termination 282.

A further embodiment of the semiconductor device of the invention including at least one p-n junction is illustrated in FIG. 25 as device 290. Device 290 is similar in structure and function to that of device 270 of FIG. 24 described above except for the location of junction extension regions 298. Junction extension region 298 is located within device 290 in accordance with the general description of location given above and more specifically located below beveled surface 280 within region 272. A portion of junction extension region 288 overlaps into region 274.

FIG. 26 shows a further embodiment of the semiconductor device of the invention including at least one p-n junction as device 300. Device 300 is substantially similar in both function and structure to device 270 of FIG. 24 described above except for the location of junction extension region 308. Junction extension region 308 is located within device 300 in accordance with the general description of location set forth above and further located within region 272 below beveled surface 280. Junction extension region 308 is separated from junction termination 282.

A further embodiment of the semiconductor device of the invention including at least one p-n junction is set forth in FIG. 27 as device 310. Device 310 is substantially similar in structure and function to device 270 of FIG. 24 described above except for the location of junction extension region 318. Junction extension region 318 is located within device 310 in accordance with the general description of location given above and further situated within region 272 below and in contact with beveled surface 280. A portion of junction extension region 318 abuts junction termination 282.

FIG. 28 shows a further embodiment of the semiconductor device of the invention including at least one p-n junction as device 320. Device 320 is similar in function and structure to device 310 described above in FIG. 27 except for the location of junction extension 328 which further extends and overlaps into region 274. Junction extension region 328 is situated within device 320 in accordance with the general description of location set forth above. More specifically, junction extension region 328 is situated within region 272 with a portion of junction extension region 328 overlapping into region 274. Further, junction extension region 328 is situated below and in contact with beveled surface 280.

Another embodiment of the invention is set forth in FIG. 29 which illustrates a portion of a semiconductor device including at least one p-n junction as device 330. Device 330 is substantially similar in structure and function to device 310 of FIG. 27 described above except for junction extension region 338 which is located separated from junction termination 282. Junction extension region 338 is located within device 330 in accordance with the general description of location given above and is further situated within region 272 below and in contact with beveled surface 280. The length of junction extension region 338 may be less than that of the portion of beveled surface 280 bordering on region 272 as long as the length of junction extension region 338 is greater than approximately ½ $W_{id}$.

Another embodiment of the invention is shown in FIG. 30 as a portion of semiconductor device 340 which includes at least one p-n junction. Device 340 is similar in structure and function to device 270 described above under the discussion of FIG. 24 except that junction extension region 348 is located overlaying a portion of beveled surface 280. Junction extension region 348 is situated on device 340 in accordance with the general description of location given above. More specifically, junction extension region 348 is situated overlaying a portion of beveled surface 280 which bounds upon region 272 and abutting junction termination 282.

FIG. 31 shows another embodiment of the semiconductor device of the invention including at least one p-n junction as device 350. Device 350 is similar in structure and function to device 340 described above under FIG. 30 except that junction extension region 358 overlays a portion of the beveled surface 280 above region 272 and overlapping onto beveled surface 280 of region 274. Junction extension region 358 is located on device 350 in accordance with the general description of location set forth above more specifically, junction extension region 358 is situated overlaying a portion of beveled surface 280 above said first and second regions.

FIG. 32 sets forth another embodiment of the semiconductor device of the invention including at least one p-n junction as device 360. Device 360 is substantially similar in structure and function to device 340 described above under the discussion of FIG. 30 except for junction extension region 368 which is located separated from junction termination 282. Junction extension region 368 is situated on device 360 in accordance with the general description of location of the junction extension region given above. More specifically, junction extension region 368 is situated overlaying a portion of the beveled surface 280 bounding on region 272.

Junction extension regions 288, 298, 308, 318, 328 and 338 of FIGS. 24–29 may be created by ion implantation and subsequent activation which may be followed by diffusion. Junction extension regions 348, 358 and 368 of FIGS. 30–32 may be formed by epitaxial growth.

It should be noted that all drawings depict different embodiments of portions of semiconductor devices of the invention before the protective passivation normally used on such devices is affixed to their surfaces.

The foregoing describes several embodiments of semiconductor devices incorporating the junction extension region of the invention to achieve nearly ideal p-n avalanche breakdown voltage and relatively low peak surface and peak bulk electric fields.

While only certain preferred features of the invention have been shown by way of illustration, many modifications and changes will occur to those skilled in the art. It is, therefore, to be understood that the present claims are intended to cover all such modifications and changes as fall within the true spirit of the invention.

What is claimed is:

1. In a semiconductor device containing at least one p-n junction including a first region of semiconductor material of a selected conductivity type having top and bottom surfaces, a second region of semiconductor material of conductivity type opposite that of said first region and having upper and lower surfaces, the lower surface of said second region being coextensive and contiguous with the top surface of said first region, a p-n junction located between said first and second regions, said first and second regions including a common edge side surface, a portion of said common edge side surface being beveled so as to pass through the entire thickness of said second region and a portion of the thickness of said first region, said beveled surface being oriented at a small acute angle with respect to the plane of said p-n junction, and a junction termination located at the intersection of said p-n junction with said beveled surface, the improvement comprising:

a junction extension region of semiconductor material of the same conductivity type of said second region, said junction extension region having a greater length than thickness, said junction extension region having a length less than the length of said beveled surface and being located in the proximity of said beveled surface and oriented approximately parallel thereto, a substantial portion of said junction extension region being located within said first region and oriented generally parallel to the plane of said junction termination.

2. The semiconductor device of claim 1 wherein $Q_{JER}$ represents the amount of charge per unit area in said junction extension region when fully depleted and $Q_{id}$ is the amount of charge per unit area present in the depletion region of an ideal junction when the ideal breakdown voltage is applied to the junction, $Q_{JER}$ having a value within the range of approximately 0.2 $Q_{id}$ to approximately 1.5 $Q_{id}$.

3. The semiconductor device of claim 2 wherein $W_{JER}$ represents the length of the portion of said junction extension region included within the first region and $W_{id}$ is the depletion width of the lightly doped side of an ideal p-n junction while the ideal junction breakdown voltage is applied thereto, $W_{JER}$ having a value within the range of approximately $\frac{1}{2}$ $W_{id}$ to 2 $W_{id}$.

4. The semiconductor device of claim 3 wherein said small acute angle is within the range of approximately 2 degrees to 12 degrees.

5. The semiconductor device of claim 3 wherein said junction extension region is located within said first region below said beveled surface, a portion of said junction extension region abutting said p-n junction.

6. The semiconductor device of claim 3 wherein said junction extension region is further situated below said beveled surface in said first region, with a portion of said junction extension region overlapping into said second region.

7. The semiconductor device of claim 3 wherein said junction extension region is situated in said first region below said beveled surface.

8. The semiconductor device of claim 3 wherein said junction extension region is situated in said first region below and in contact with said beveled surface, a portion of said junction extension region abutting said junction termination.

9. The semiconductor device of claim 3 wherein said junction extension region is situated in said first region with a portion of said junction extension region overlapping into said second region, said junction extension region located below and in contact with said beveled surface.

10. The semiconductor device of claim 3 wherein said junction extension region is situated within said first region below and in contact with said beveled surface.

11. In a semiconductor device containing at least one p-n junction including a first region of semiconductor material of a selected conductivity type having top and bottom surfaces, a second region of semiconductor material of conductivity type opposite that of said first region and having upper and lower surfaces, the lower surface of said second region being coextensive and contiguous with the top surface of said first region, a p-n junction located between said first and second regions, said first and second regions including a common edge side surface, a portion of said common edge side surface being beveled so as to pass through the entire thickness of said second region and a portion of the thickness of said first region, said beveled surface being oriented at a small acute angle with respect to the plane of said p-n junction, and a junction termination located at the intersection of said p-n junction with said beveled surface, the improvement comprising:

a junction extension region of semiconductor material of the same conductivity type of said second region, said junction extension region having a greater length than thickness, said junction extension region having a length less than the length of said beveled surface and being situated upon of said beveled surface and oriented approximately parallel thereto, a substantial portion of said junction extension region overlapping the portion of said beveled surface bounding on said first region.

12. The semiconductor device of claim 10 wherein $Q_{JER}$ represents the amount of charge per unit area in said junction extension region when fully depleted and $Q_{id}$ is the amount of charge per unit area present in the depletion region of an ideal junction when the ideal breakdown voltage is applied to the junction, $Q_{JER}$ having a value within the range of approximately 0.2 $Q_{id}$ to approximately 1.5 $Q_{id}$.

13. The semiconductor device of claim 11 wherein $W_{JER}$ represents the length of the portion of said junction extension region included within the first region and $W_{id}$ is the depletion width of the lightly doped side of an ideal p-n junction while the ideal junction breakdown voltage is applied thereto, $W_{JER}$ having a value within the range of approximately $\frac{1}{2}$ $W_{id}$ to 2 $W_{id}$.

14. The semiconductor device of claim 12 wherein said junction extension region overlays a portion of the beveled surface bounding on said first region, a portion of said junction extension region abutting said junction termination.

15. The semiconductor device of claim 12 wherein said junction extension region overlays a portion of said beveled surface bounding on said first and second regions.

16. The semiconductor device of claim 12 wherein said junction extension region is situated overlaying a portion of said beveled surface bounding on said first region.

17. The semiconductor device of claims 13, 14 or 15 wherein said junction extension region comprises an epitaxial layer.

* * * * *